United States Patent
Do

(10) Patent No.: US 7,414,897 B2
(45) Date of Patent: Aug. 19, 2008

(54) INTERNAL VOLTAGE GENERATOR CAPABLE OF REGULATING AN INTERNAL VOLTAGE OF A SEMICONDUCTOR MEMORY DEVICE

(75) Inventor: Chang-Ho Do, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/905,791

(22) Filed: Oct. 4, 2007

(65) Prior Publication Data

US 2008/0031058 A1 Feb. 7, 2008

Related U.S. Application Data

(62) Division of application No. 11/184,925, filed on Jul. 20, 2005, now Pat. No. 7,289,377.

(30) Foreign Application Priority Data

Nov. 4, 2004 (KR) .......................... 2004-0089330

(51) Int. Cl.
*G11C 5/14* (2006.01)
*G11C 29/00* (2006.01)
*G05F 1/10* (2006.01)

(52) U.S. Cl. ............................. 365/189.09; 365/189.08; 365/189.06; 365/189.11; 365/201; 365/229; 365/228; 327/537; 327/538; 327/541

(58) Field of Classification Search ............. 365/189.09, 365/189.08, 189.06, 189.11, 229, 228, 227, 365/201; 327/537, 535, 538, 541
See application file for complete search history.

(56) References Cited

U.S. PATENT DOCUMENTS

| 5,638,083 | A | 6/1997 | Mangeson | |
|---|---|---|---|---|
| 6,038,191 | A | 3/2000 | Fukuhara et al. | |
| 7,068,547 | B2 | 6/2006 | Do | |
| 7,289,377 | B2* | 10/2007 | Do | 365/189.09 |
| 2005/0254333 | A1* | 11/2005 | Do | 365/230.08 |
| 2006/0091937 | A1 | 5/2006 | Do | |
| 2006/0245234 | A1 | 11/2006 | Do | |
| 2008/0031058 | A1* | 2/2008 | Do | 365/189.09 |
| 2008/0031059 | A1* | 2/2008 | Do | 365/189.09 |

FOREIGN PATENT DOCUMENTS

KR  10-2000-0056315  9/2000

* cited by examiner

*Primary Examiner*—Andrew Q Tran
(74) *Attorney, Agent, or Firm*—McDermott Will & Emery LLP

(57) ABSTRACT

An internal voltage generator maintains stable level of an internal voltage without increasing physical area. The internal voltage generator includes an active level detector for detecting a level of an internal voltage by comparing the level of the internal voltage and a level of a reference voltage to thereby output a first active driving signal, a first active driver for providing the internal voltage in response to the first active driving signal, a driving time controller for generating a time driving signal activated for a predetermined time, an active driving controller for activating a second active driving signal while the time driving signal is activated and for outputting the first active driving signal as the second active driving signal while the time driving signal is inactivated, and a second active driver for providing the internal voltage in response to the second active driving signal.

13 Claims, 6 Drawing Sheets

US 7,414,897 B2

INTERNAL VOLTAGE GENERATOR CAPABLE OF REGULATING AN INTERNAL VOLTAGE OF A SEMICONDUCTOR MEMORY DEVICE

RELATED APPLICATIONS

This application is a divisional of U.S. application Ser. No. 11/184,925, filed Jul. 20, 2005 now U.S. Pat. No. 7,289,377, which claims priority of Republic of Korea Application No. 2004-0089330, filed Nov. 4, 2004, the contents of which are hereby incorporated by reference.

FIELD OF INVENTION

The present invention relates to a semiconductor design technique; and, more particularly, to an internal voltage generator for maintaining stable level of an internal voltage.

DESCRIPTION OF PRIOR ART

As a semiconductor memory device is used for a mobile product which requires low power consumption, current consumption of the semiconductor memory device becomes an important factor in evaluating device performance.

The semiconductor memory device uses a stand-by driver of low driving capability for a stand-by mode of low current consumption. During the stand-by mode, the semiconductor memory device waits an input of external commands without performing actual operation. The semiconductor memory device supplies current by additionally driving an active driver for an active mode which consumes more current for performing operations caused by the external commands. In other words, the semiconductor memory device uses the stand-by driver of low driving power for the stand-by mode. Further, the semiconductor memory device uses the active driver of high driving power for the active mode which requires a fast response time.

FIG. 1 shows a block diagram of a conventional internal voltage generator.

Referring to FIG. 1, the conventional internal voltage generator includes a normal level detecting unit 10 for detecting a level of an internal voltage VCORE relative to a reference voltage VR, a normal driver PM1 for providing the internal voltage VCORE under the control of the normal level detecting unit 10, an active period detecting unit 20 for outputting an active period signal ratv by detecting an active period, an active level detecting unit 30 for detecting the level of the internal voltage VCORE relative to the reference voltage VR in response to the active period signal ratv, a first active driver PM2 for providing the internal voltage VCORE under the control of the active level detecting unit 30, a driving time controlling unit 40 for generating a second active driving signal act_tm_drv that is activated for a predetermined time after the activation of the active period signal ratv, and a second active driver PM3 for providing the internal voltage VCORE during the activation period of the second active driving signal act_tm_drv.

The active period detecting unit 20 activates the active period signal ratv in response to an active command ACT and deactivates the active period signal ratv in response to a pre-charge signal PCG.

Herein, the reference voltage VR has a desired level of the internal voltage VCORE.

FIG. 2 is a waveform diagram illustrating an operation of the conventional internal voltage generator shown in FIG. 1.

Basically, the normal level detecting unit 10 is continuously turned on and controls the normal driver PM1 by detecting the level of the internal voltage VCORE. That is, the normal level detecting unit 10 activates a normal driving signal nrm_drv when the internal voltage VCORE has a lower level than the reference voltage VR. The normal driver PM1 supplies the internal voltage VCORE. The normal level detecting unit 10 deactivates the normal driving signal nrm_drv when the internal voltage VCORE has a higher level than the reference voltage VR to turn off the normal driver PM1.

Meanwhile, when the active command ACT and row addresses are inputted, thousands of memory cell data connected to a corresponding word-line are sensed and amplified. Accordingly, consumption of the internal voltage VCORE increases and, in turn, the level of the internal voltage VCORE rapidly decreases.

At this time, the active period detecting unit 20 activates the active period signal ratv in response to the input of the active command ACT. Accordingly, the active level detecting unit 30 detects the level of the internal voltage VCORE relative to the reference voltage VR in response to the active period signal ratv to make the first active driver PM2 additionally supply the internal voltage VCORE. Further, the driving time controlling unit 40 activates the second active driving signal act_tm_drv having a predetermined activation period from the activation of the active period signal ratv in order to drive the second active driver PM3 to supply the internal voltage VCORE.

Since the first active driver PM2 and the second active driver PM3 additionally supply the internal voltage VCORE, the level of the internal voltage VCORE is increased to maintain the level of the reference voltage VR.

During the activation period of the active period signal ratv, the normal and active level detecting units 10 and 20 keep detecting the level of the internal voltage VCORE to drive the normal driver PM1 and the first active driver PM2 so as to make the internal voltage VCORE maintains the level of the reference voltage VR.

When the pre-charge command PCG is inputted, the active period detecting unit 20 deactivates the active period signal ratv so as to turn off the active level detecting unit 30. Accordingly, during the deactivation period of the active period signal ratv, only the normal level detecting unit 10 is activated to detect the level of the internal voltage VCORE, so that the normal driver PM1 is operated to maintain a stable level of the internal voltage VCORE.

As described above, the conventional internal voltage generator basically accomplishes the stable level of the internal voltage VCORE by the normal level detecting unit 10 and the normal driver PM1. Further, the conventional internal voltage generator maintains the stale level of the internal voltage VCORE by using the first and the second active driving units PM2 and PM3 when the consumption of the internal voltage VCORE is increased in response to the active command ACT.

Particularly, since most of the current consumption occurs at the initial input period of the active command ACT in the active period, the driving time controlling unit 40 and the second active driver PM3 are used for supplying the internal voltage VCORE in addition to the active level detecting unit 30 and the first active driver PM2 that are driven by detecting the level of the internal voltage. The driving time controlling unit 40 and the second active driver PM3 are controlled to provide the internal voltage VCORE for a predetermined time α shown in FIG. 2 in response to the input of the active command ACT.

The conventional internal voltage generator employs several drivers therein and the number of the drivers changes depending on the consumption of the internal voltage, so that unnecessary size increase of the drivers and unnecessary current consumption can be avoided.

In the meantime, the internal voltage is supplied through the normal driver and the first active driver after the initial time of the active period is passed. Therefore, if the consumed amount of the internal voltage is higher than the supplied amount, the internal voltage becomes unstable.

Such an unstable voltage after the initial time of the active period is passes can be avoided by increasing a size of the first active driver. However, such a solution increases a size of the internal voltage generator.

SUMMARY OF INVENTION

Embodiments of the present invention are directed to provide an internal voltage generator for supplying a stable level of an internal voltage without increasing a physical area.

In accordance with an aspect of the present invention, there is provided an internal voltage generator including a normal level detecting unit for detecting level of the internal voltage relative to a reference voltage; a normal driver for supplying the internal voltage under the control of the normal level detecting unit; an active period detecting unit for detecting an active period to output an active period signal; an active level detecting unit for detecting the level of the internal voltage relative to the reference voltage in response to the active period signal; a first active driver for supplying the internal voltage under the control of the active level detecting unit; an active driving controlling unit for activating a first active driving signal for a predetermined initial time of the active period in response to the active period signal and the output signal of the first active level detecting unit and for activating the first active driving signal depending on the internal voltage relative to the reference voltage after the predetermined initial time of the active period; and a second active driver for supplying the internal voltage in response to the first active driving signal.

In accordance with another aspect of the present invention, there is provided an internal voltage generator including a normal driver for supplying an internal voltage; a first and a second drivers for supplying the internal voltage; a normal level detecting unit for detecting the internal voltage relative to a reference voltage to control driving of the normal driver; an active period detecting unit for detecting an active period to output an active period signal; an active level detecting unit for detecting the level of the internal voltage relative to the reference voltage in response to the active period signal to control driving of the first active driver; a test mode signal generating unit for generating a test mode signal; and an active driving controlling unit for driving the second active driver without regard to the level of the internal voltage for a predetermined time after activation of the active period signal and for driving the second active driver in response to the test mode signal and the output signal of the active level detecting unit after the predetermined time.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal voltage generator for used in a semiconductor memory device in accordance with the present invention will be described in detail referring to the accompanying drawings.

Figure 3:
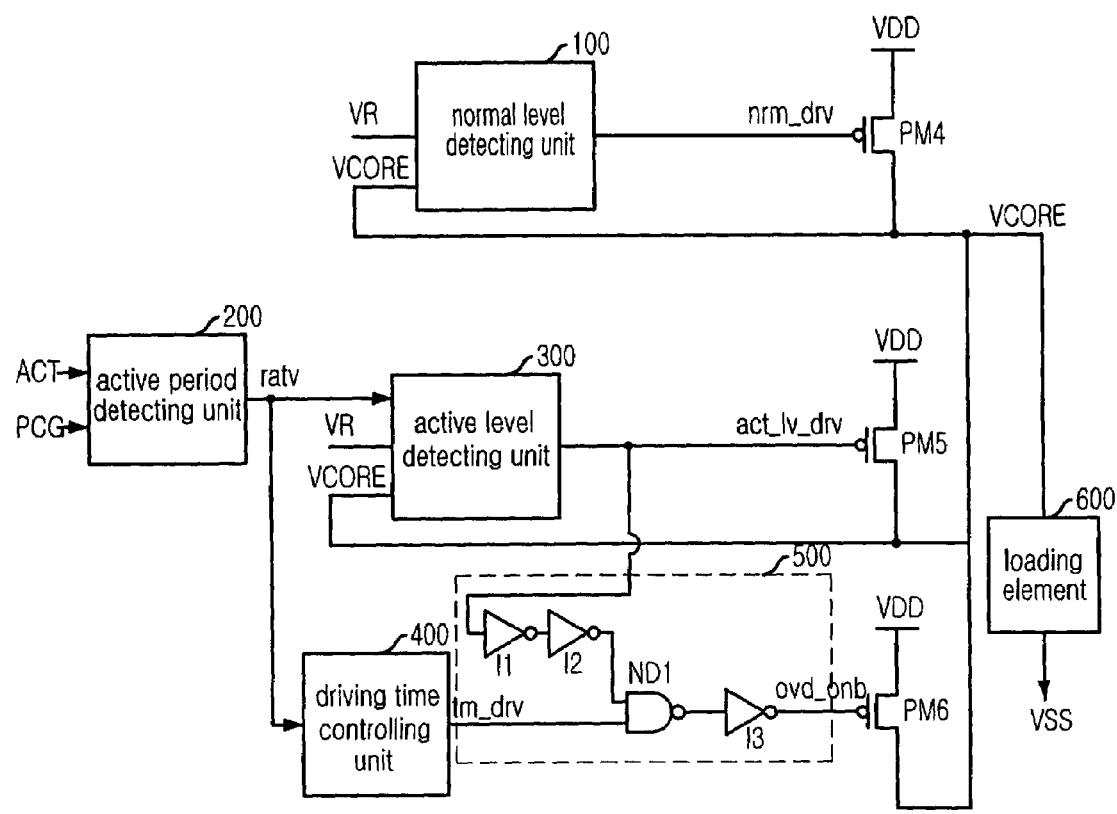
FIG. 3 provides a diagram of an internal voltage generator in accordance with a first embodiment of the present invention.

FIG. 3 is a block diagram of an internal voltage generator in accordance with a first embodiment of the present invention.

The internal voltage generator includes a normal level detecting unit 100 for detecting a level of an internal voltage VCORE relative to a reference voltage VR, a normal driver PM4 for supplying the internal voltage VCORE under the control of the normal level detecting unit 100, an active period detecting unit 200 for outputting an active period signal ratv by detecting an active period, an active level detecting unit 300 for detecting the level of the internal voltage VCORE relative to the reference voltage VR in response to the active period signal ratv, a first active driver PM5 for supplying the internal voltage VCORE under the control of the active level detecting unit 300, an active drive controlling unit for activating a second active driving signal ovd_onb for a predetermined initial time of the active period in response to the active period signal ratv and the output signal act_lv_drv of the active level detecting unit 300 and for activating the second active driving signal ovd_onb depending on the level of the internal voltage VCORE relative to the reference voltage VR after the predetermined initial time of the active period is passed, and a third active driver PM6 for supplying the internal voltage VCORE in response to the second active driving signal ovd_onb.

Further, the active drive controlling unit includes a driving time controlling unit 400 for generating a time driving signal tm_drv activated for a predetermined time after the active period signal ratv is enabled, and an additional controlling unit 500 for activating the second active driving signal ovd_onb during the activation of the time driving signal tm_drv and for outputting the output signal act_lv_drv of the active level detecting unit 300 as the second active driving signal ovd_onb during the deactivation of the time driving signal tm_drv.

The additional controlling unit 500 includes a buffer for buffering the output signal act_lv_drv of the active level detecting unit 300, a NAND gate ND1 for logically combining an output signal of the buffer and the time driving signal tm_drv, and an inverter I3 for inverting an output signal of the NAND gate ND1 to output the second active driving signal ovd_onb. The buffer includes, e.g., two inverters I1 and I2 serially connected to each other.

Figure 4:
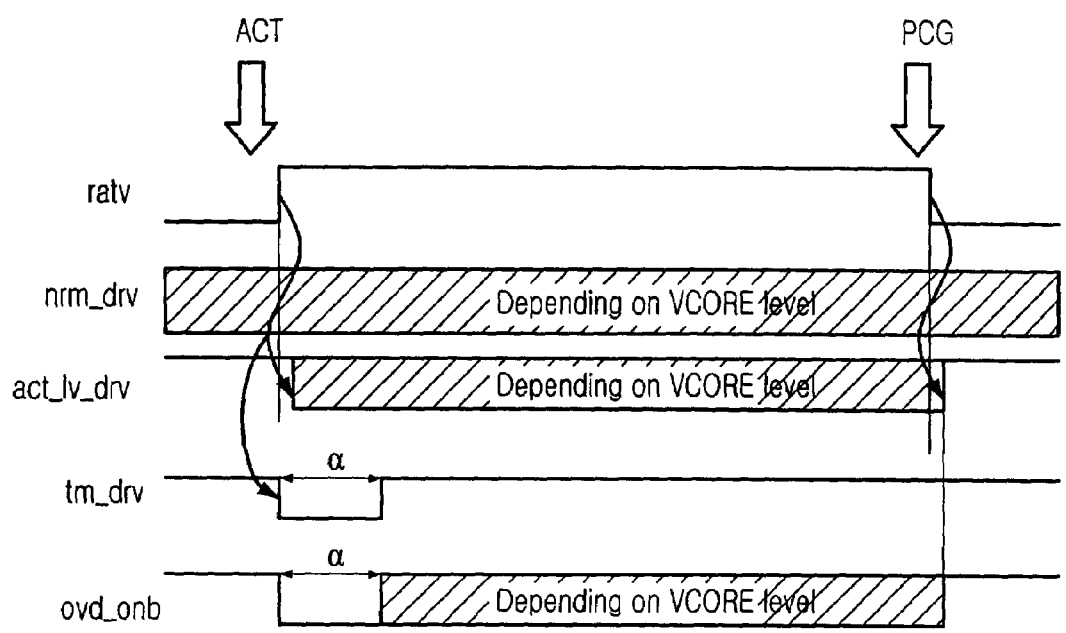
FIG. 4 is a waveform diagram for illustrating an operation of the an internal voltage generator in FIG. 3.

FIG. 4 is a waveform diagram illustrating an operation of the internal voltage generator shown in FIG. 3.

First, when an active command ACT is applied, the internal voltage VCORE is consumed due to an operation of a loading element 600 corresponding to the active command ACT and, therefore, the level of the internal voltage VCORE falls down.

At this moment, the active period detecting unit 200 activates the active period signal ratv in response to the active command ACT so as to additionally drive the first and the second active drivers PM5 and PM6 for supplying the internal voltage VCORE.

That is, the active level detecting unit 300 detects the level of the internal voltage VCORE relative to the reference voltage VR in response to the active period signal ratv and generates the first active period driving signal act_lv_drv. The first active driver PM5 supplies the internal voltage VCORE in response to the first active period driving signal act_lv_drv.

Further, the driving time controlling unit 400 outputs the time controlling signal tm_drv activated during the initial time of the active period. The additional controlling unit 500 outputs the time controlling signal tm_drv as the second active driving signal ovd_onb. The second active driver PM6 supplies the initial voltage VCORE in response to the second active driving signal ovd_onb. In turn, when the time driving signal tm_drv is deactivated, the additional controlling unit 500 outputs the output signal act_lv_drv of the active level detecting unit 300 as the second active driving signal ovd_onb to have the second active driver PM6 supply the internal voltage VCORE.

Figure 1:
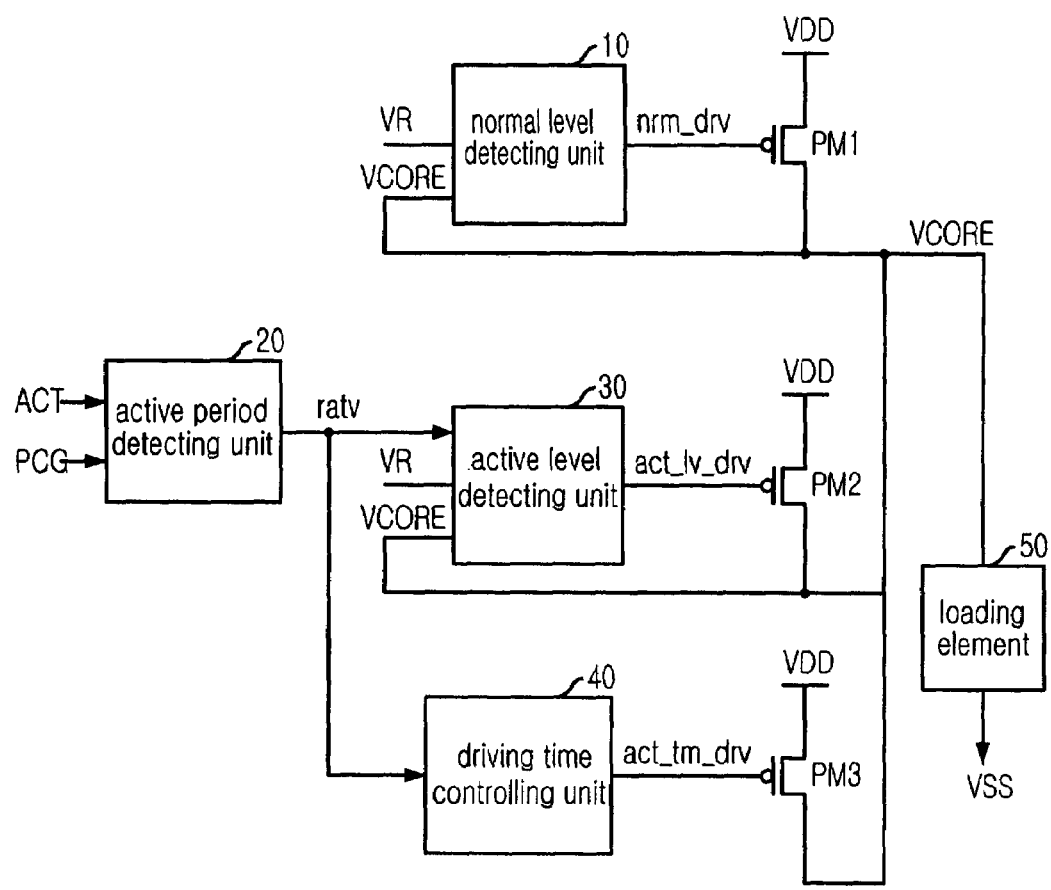
FIG. 1 shows a diagram of a conventional internal voltage generator.
Figure 2:
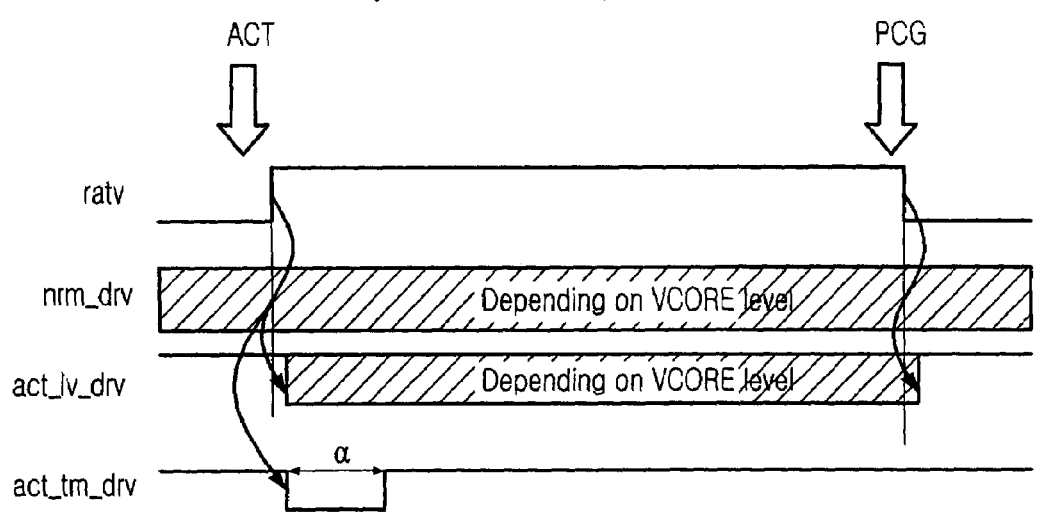
FIG. 2 is a waveform diagram for illustrating an operation of the conventional internal voltage generator in FIG. 1.

As described above, the internal voltage generator according to the first embodiment of the present invention makes the second active driver PM6 supply the internal voltage VCORE under the control of the active level detecting unit 300 further after the predetermined initial time α of the active period is passed, whereas, the second active driver PM3, included in the conventional internal voltage generator shown in FIG. 1, is driven only during the predetermined initial time α without regard to the level of the internal voltage VCORE.

Accordingly, since the internal voltage VCORE is supplied through the first and the second drivers PM5 and PM6 during the active period, driving power of the drivers for supplying the internal voltage VCORE during the active period is increased and, therefore, the level of the internal voltage VCORE can be maintained stable without increasing the size of the internal voltage generator.

Meanwhile, since the active level detecting unit 300 needs a response time for detecting the level of the internal voltage VCORE relative to the reference voltage VR and turning on/off the first and the second active drivers PM5 and PM6, the first and the second active drivers PM5 and PM6 cannot be turned off immediately when the internal voltage becomes higher than the reference voltage. Therefore, the internal voltage rises higher than the reference voltage. Further, since the internal voltage VCORE is supplied through the first and the second active drivers PM5 and PM6, the level of the internal voltage VCORE excessively increases.

Accordingly, another internal voltage generator for monitoring the level increase of the internal voltage VCORE due to additional driving of the second active driver PM6 in a test mode will be described with referring to FIG. 5.

Figure 5:
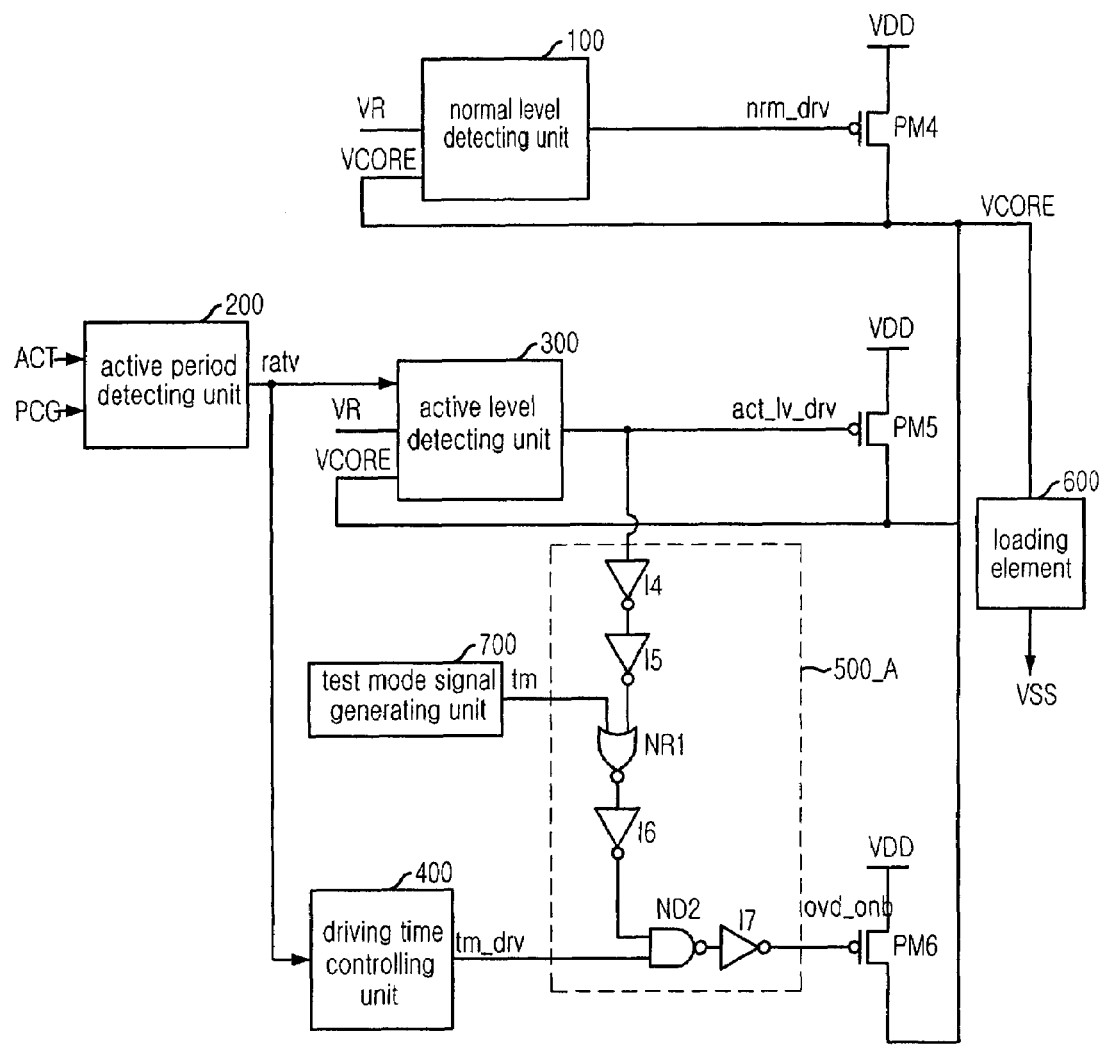
FIG. 5 offers an internal circuit diagram of an internal voltage generator in accordance with a second embodiment of the present invention.

FIG. 5 offers a block diagram of an internal voltage generator in accordance with a second embodiment of the present invention. In FIG. 5, the same or similar constituents as or to the constituents of FIG. 3 are designated by the same reference numerals, and a detailed description thereof will not be made in order to avoid redundancy Referring to FIG. 5, an additional controlling unit 500_A includes a buffer for buffering the output signal from the active level detecting unit 300, a NOR gate NR1 for logically combining an output signal of the buffer and a test mode signal tm, an inverter I6 for inverting an output signal of the NOR gate NR1, a NAND gate ND2 for logically combining an output signal of the inverter I6 and the time driving signal tm_drv, and an inverter I7 for inverting an output signal of the NAND gate ND2 to output the second active driving signal ovd_onb. The buffer includes two inverters I4 and I5 serially connected to each other.

Meanwhile, compared to the internal voltage generator of the first embodiment shown in FIG. 3, the internal voltage generator of the second embodiment shown in FIG. 5 further includes a test mode signal generating unit 700.

In the following, it will be described for the operation of the active drive controlling unit with the test mode signal generating unit 700.

When the active period detecting unit 200 activates the active period signal ratv in response to the input of the active command ACT, the driving time controlling unit 400 outputs the time driving signal tm_drv activated for a predetermined time after the activation of the active period signal ratv.

First, in case that the time driving signal tm_drv is active, the additional controlling unit 500_A outputs the time driving signal tm_drv as the second active driving signal ovd_onb and, therefore, the second active driver PM6 supplies the internal voltage VCORE for a predetermined time without regard to the level of the internal voltage VCORE.

Further, in case that the time driving signal tm_drv is inactive, the additional controlling unit 500_A outputs the second active driving signal ovd_onb having a logic level 'H' without regard to the output signal act_lv_drv of the active level detecting unit 300 if the output signal tm of the test mode signal generating unit 700 is activated to logic level 'H'. Accordingly, the second active driver PM6 is turned off by the second active driving signal ovd_onb.

The additional controlling unit 500_A outputs the output signal act_lv_drv of the active level detecting unit 300 as the second active driving signal ovd_onb when the output signal tm of the test mode signal generating unit 700 is inactive in a deactivation period of the time driving signal tm_drv. That is, the second active driver PM6 is driven by the active level detecting unit 300.

As described above, the internal voltage generating unit of the second embodiment further includes the test mode signal generating unit 700 so that the second active driver PM6 can be controlled by the active level detecting unit 300 or turned off by the test mode signal tm when the time driving signal tm_drv is deactivated during the active period.

Therefore, the internal voltage generator of the second embodiment is capable of monitoring if additional driving of the second active driver PM6 is needed in the deactivation period of the time driving signal tm_drv during the active period or not, so that excessive increase of the internal voltage VCORE can be avoided.

As described above, the internal voltage generators of the first and the second embodiments share the active level detecting unit 300 that drives the first active driver PM5 to control driving of the second active driver PM6.

Figure 6:
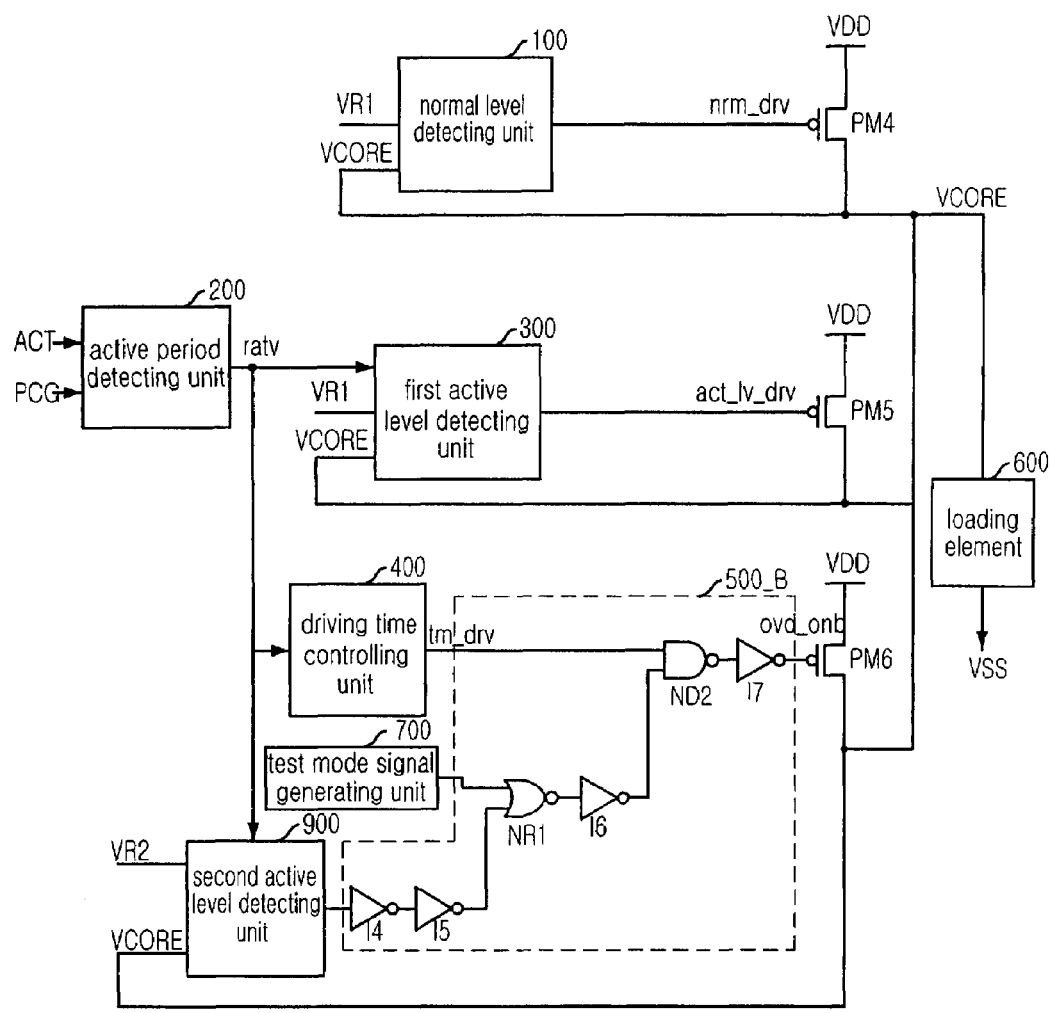
FIG. 6 is a diagram of an internal voltage generator in accordance with a third embodiment of the present invention.

FIG. 6 is a block diagram of an internal voltage generator in accordance with the third embodiment of the present invention. Compared with FIG. 5, the internal voltage generator in FIG. 6 further includes a second active level detecting unit 900 for driving the second active driver PM6.

The normal level detecting unit 100 and the first active level detecting unit 300 detect the level of the internal voltage VCORE relative to the first reference voltage VR1 while the second active level detecting unit 900 detects the level of the internal voltage VCORE relative to the second reference voltage VR2.

Particularly, since the level of the second reference voltage VR2 is lower than the first reference voltage VR1, the second active level detecting unit 900 activates its output signal only if the level of the internal voltage VCORE is lower than the second reference voltage VR2 to drive the second active driver PM6.

Accordingly, during the initial time of the active period, the internal voltage generator of the third embodiment supplies the internal voltage VCORE through the first active driver PM5 driven through the first active level detecting unit 300 and the second active driver PM6 driven for a predetermined time. After the initial time of the active period is passed, the internal voltage VCORE is supplied through the normal driver PM4 and the first active driver PM5 when the level of the internal voltage VCORE is lower than the first reference voltage VR1. Meanwhile, the internal voltage VCORE is supplied through the first and the second active drivers PM5 and PM6 when the level of the internal voltage VCORE is lower than the second reference voltage VR2.

Therefore, after the initial active period is passed, the first and the second active drivers PM5 and PM6 supply the internal voltage VCORE, so that excessive level increase of the internal voltage can be avoided.

Further, because the internal voltage generator of the third embodiment of the present invention includes the test mode signal generating unit 700, it is possible to monitor with the test mode signal whether the internal voltage VCORE is increased excessively due to driving of the second active driver PM6 or not.

As described above, the internal voltage generators of the first to the third embodiments of the present invention stably supply the internal voltage without increasing a physical area to increase driving power of the driver therein.

Further, the internal voltage generators of the second and the third embodiments are capable of monitoring excessive increase of the internal voltage due to the active driver additionally driven after the predetermined initial time is passed through the test mode signal. Therefore, the excessive increase of the internal voltage can be avoided.

Further, the internal voltage generator of the third embodiment includes an additional level detecting unit for the active driver. The additional level detecting unit is driven after the predetermined initial time of the active period is passed to adjust the level of the reference voltage. Therefore, an additional driving point of the active driver can be adjusted to avoid excessive increase of the internal voltage. Meanwhile, an additional second active level detecting unit for the second active driver can be applied to the internal voltage generator of the first embodiment to thereby prevent an excessive increase of the internal voltage.

The present application contains subject matter related to Korean patent application No. 2004-89330, filed in the Korean Patent Office on Nov. 4, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for use in a semiconductor memory device, comprising:
   a normal level detecting unit for detecting a level of an internal voltage relative to a first reference voltage;
   a normal driver for supplying the internal voltage under the control of the normal level detecting unit;
   an active period detecting unit for detecting an active period to output an active period signal;
   a first active level detecting unit for detecting the level of the internal voltage relative to the first reference voltage in response to the active period signal;
   a first active driver for supplying the internal voltage under the control of the first active level detecting unit;
   a second active level detecting unit for detecting the level of the internal voltage relative to a second reference voltage in response to the active period signal;
   an active driving controlling unit for activating a first active driving signal for a predetermined initial time of the active period in response to the active period signal and an output signal of the second active level detecting unit and for activating the first active driving signal depending on the internal voltage relative to the reference voltage after the predetermined initial time of the active period is passed; and
   a second active driver for supplying the internal voltage in response to the first active driving signal.

2. The internal voltage generator as recited in claim 1, wherein the level of the second reference voltage is equal to or lower than the level of the first reference voltage.

3. The internal voltage generator as recited in claim 2, wherein the active driving controlling unit includes:
   a driving time controlling unit for generating a time driving signal that is activated for the predetermined time after the activation of the active period signal is passed; and
   additional controlling unit for activating the first active driving signal during the activation of the time driving signal and for outputting the output signal of the second active level detecting unit as the first active driving signal during the deactivation of the time driving signal.

4. The internal voltage generator as recited in claim 3, wherein the additional controlling unit includes:
   a buffer, having a first and a second inverters serially coupled to each other, for buffering the output signal of the second active level detecting unit;
   a logic gate for logically combining an output signal of the buffer and the time driving signal; and
   a third inverter for inverting an output signal of the logic gate to output the first active driving signal.

5. An internal voltage generator, comprising:
   a normal driver for supplying an internal voltage;
   first and second active drivers for supplying the internal voltage;
   a normal level detecting unit for detecting the internal voltage reletive to a first reference voltage to control the driving of the normal driver;
   an active period detecting unit for detecting an active period to output an active period signal;
   a first active level detecting unit for detecting the level of the internal voltage relative to the first reference voltage in response to the active period signal to control the driving of the first active driver;
   a second active level detecting unit for detecting the level of the internal voltage relative to a second reference voltage in response to the active period signal;
   a test mode signal generating unit for generating a test mode signal; and
   an active driving controlling unit for driving the second active driver without regard to the level of the internal voltage during a predetermined time after the activation of the active period signal and for driving the second active driver in response to the test mode signal and an output signal of the second active level detecting unit after the predetermined time of the active period is passed.

6. The internal voltage generator as recited in claim 5, wherein the level of the second reference voltage is equal to or lower than the level of the first reference voltage.

7. The internal voltage generator as recited in claim 5, wherein the active driving controlling unit includes:
   a driving time controlling unit for generating a time driving signal that is activated for the predetermined time after the activation of the active period signal; and
   an additional controlling unit for activating the first active driving signal to control the driving of the second active driver during the activation of the time driving signal and for outputting the output signal of the active level detecting unit as the first active driving signal in response to the test mode signal during the deactivation of the time driving signal.

8. The internal voltage generator as recited in claim 7, wherein the additional controlling unit deactivates the first active driving signal if the time driving signal is deactivated and the test mode signal is activated, and outputs the output signal of the second active level detecting unit as the first active driving signal if the time driving signal is deactivated and the test mode signal is deactivated.

9. The internal voltage generator as recited in claim 8, wherein the additional controlling unit includes:
   a buffer, having first and a second inverters serially coupled to each other, for buffering the output signal of the second active level detecting unit;
   a first logic gate for logically combining an output signal of the buffer and the test mode signal;
   a third inverter for inverting an output signal of the first logic gate;
   a second logic gate for logically combining an output signal of the third inverter and the time driving signal; and
   a fourth inverter for inverting an output signal of the second logic gate to output the first active driving signal.

10. An internal voltage generator for use in a semiconductor memory device, comprising:
    a first active level detecting unit for detecting a level of the internal voltage by comparing the level of the internal voltage and a level of a first reference voltage to thereby output a first active driving signal;
    a first active driver for providing the internal voltage in response to the first active driving signal;
    a second active level detecting unit for detecting the level of the internal voltage by comparing the level of the internal voltage and a level of a second reference voltage;
    a test mode signal generating unit for generating a test mode signal;
    a driving time controlling unit for generating a time driving signal activated for a predetermined time;
    a active driving controller for activating a second active driving signal while the time driving signal is activated and for outputting an output from the second active level detecting unit in response to the test mode signal while the time driving signal is inactivated; and
    a second active driver for providing the internal voltage in response to the second active driving signal.

11. The internal voltage generator as recited in claim 10, wherein the level of the second reference voltage is lower than the level of the first reference voltage.

12. The internal voltage generator as recited in claim 11, wherein the active driving controller inactivates when the time driving signal is inactivated and the test mode signal is activated and outputting the output from the second active level detecting unit when the time driving signal and the test mode signal are inactivated.

13. The internal voltage generator as recited in claim 12, wherein the active driving controller includes:
    a buffer, having first and second buffers serially connected to each other, for buffering the output from the second active level detecting unit;
    a first logic gate for logically combining an output from the buffer and the test mode signal;
    a third inverter for inverting an output from the first logic gate;
    a second logic gate for logically combining an output of the third inverter and the time driving signal; and
    a fourth inverter for inverting an output from the second logic gate to thereby output the second active driving signal.

* * * * *